(12) United States Patent
Marushita (10) Patent No.: US 10,310,473 B1
(45) Date of Patent: Jun. 4, 2019

(54) SYSTEMS AND METHODS FOR PATH COMMAND GENERATION

(71) Applicant: Mitsubishi Electric Corporation, Chiyoda-ku (JP)

(72) Inventor: Yoshihiro Marushita, Vernon Hills, IL (US)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/827,780

(22) Filed: Nov. 30, 2017

(51) Int. Cl.
| | |
|---|---|
| *G05B 17/02* | (2006.01) |
| *G05B 17/00* | (2006.01) |
| *G05B 19/042* | (2006.01) |
| *B23K 26/04* | (2014.01) |
| *G06F 8/61* | (2018.01) |
| *G06F 17/50* | (2006.01) |

(52) U.S. Cl.
CPC ........ *G05B 19/0426* (2013.01); *B23K 26/043* (2013.01); *G05B 17/00* (2013.01); *G05B 17/02* (2013.01); *G06F 8/61* (2013.01); *G05B 2219/23452* (2013.01); *G05B 2219/23456* (2013.01); *G06F 17/5009* (2013.01)

(58) Field of Classification Search
CPC ............................... H02P 31/00; G05B 17/02
USPC .......................................................... 318/558
See application file for complete search history.

(56) References Cited

U.S. PATENT DOCUMENTS

| | | | | |
|---|---|---|---|---|
| 4,841,448 A | * | 6/1989 | Ford | ...................... G05D 1/0623 244/181 |
| 4,972,321 A | * | 11/1990 | Kahler | .................. G05D 1/0083 244/183 |
| 5,005,135 A | * | 4/1991 | Morser | ................ G05B 19/373 318/571 |
| 5,140,236 A | * | 8/1992 | Kawamura | ......... G05B 19/4103 318/568.1 |
| 7,139,244 B1 | * | 11/2006 | Cordsmeyer | ....... H04L 12/2856 370/250 |

(Continued)

FOREIGN PATENT DOCUMENTS

| | | |
|---|---|---|
| JP | 2009-48396 A | 3/2009 |
| JP | 2012-79290 A | 4/2012 |
| JP | 2012-243152 A | 12/2012 |

OTHER PUBLICATIONS

"Control and Monitoring System for Social Infrastructure MELViz iQ PlantSuite", Mitsubishi Electric Corporation, Empowering Industries, http://mitsubishienergy.com/docs/IQ-PlantSuite.pdf, May 15, 2013, 60 pages.

(Continued)

*Primary Examiner* — Bentsu Ro
(74) *Attorney, Agent, or Firm* — Oblon, McClelland, Maier & Neustadt, L.L.P.

(57) ABSTRACT

A system for path command generation includes an industrial machine, an interface accessible via a remote device, and a server communicably coupled to the industrial machine and the remote device via a network. The server includes processing circuitry configured to calculate an optimum path command, simulate the optimum path command based on the calculation of the optimum path command, calculate a cycle time and error of the path command, determine if the path command is acceptable, and transmit path command data to the industrial machine in response to the acceptable path command being selected.

27 Claims, 7 Drawing Sheets

(56) References Cited

U.S. PATENT DOCUMENTS

| | | | |
|---|---|---|---|
| 8,050,800 B2 * | 11/2011 | Miller | G05B 19/416 318/568.11 |
| 2005/0177330 A1 | 8/2005 | Huang | |
| 2009/0089234 A1 | 4/2009 | Sturrock et al. | |
| 2012/0007536 A1 * | 1/2012 | Iwashita | G05B 19/4069 318/573 |
| 2014/0180644 A1 | 6/2014 | Maturana et al. | |
| 2015/0134317 A1 | 5/2015 | Maturana et al. | |

OTHER PUBLICATIONS

"$_{MELSOFT}$ MT Works2", Mitsubishi Electric Corporation, Global-Factory Automation, http://www.mitsubishielectric.com/fa/products/cnt/ssc/smerit/mt_works2/index.html, May 15, 2013, 3 pages.

Takayuki Wakana, "Servo Gain Self-Adjustment Function in MELSERVO", Mitsubishi Electric Advance. Technical Reports, Mar. 2010, pp. 2-4.

Japan International Search Report dated Oct. 30, 2018, no English translation, 2 pages.

* cited by examiner

SYSTEMS AND METHODS FOR PATH COMMAND GENERATION

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Computing a path command for an industrial machine is known to have various difficulties in selecting the best input conditions for the task. For example, a larger operation speed correspond to a larger path error margin. However, when reducing operating speed to improve path error margin, the cycle time increases. In general, modifying the path command with specific conditions is difficult because many modifications, and even slight modifications, can violate other aspects of the path command generation due to limitations of the industrial machine, for example.

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

According to embodiments of the disclosed subject matter, a system for path command generation includes an industrial machine, an interface accessible via a remote device, and a server communicably coupled to the industrial machine and the remote device via a network. The server includes processing circuitry configured to calculate an optimum path command, simulate the optimum path command based on the calculation of the optimum path command, calculate a cycle time and error of the path command, determine if the path command is acceptable, and transmit path command data to the industrial machine in response to the acceptable path command being selected.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Figure 1:
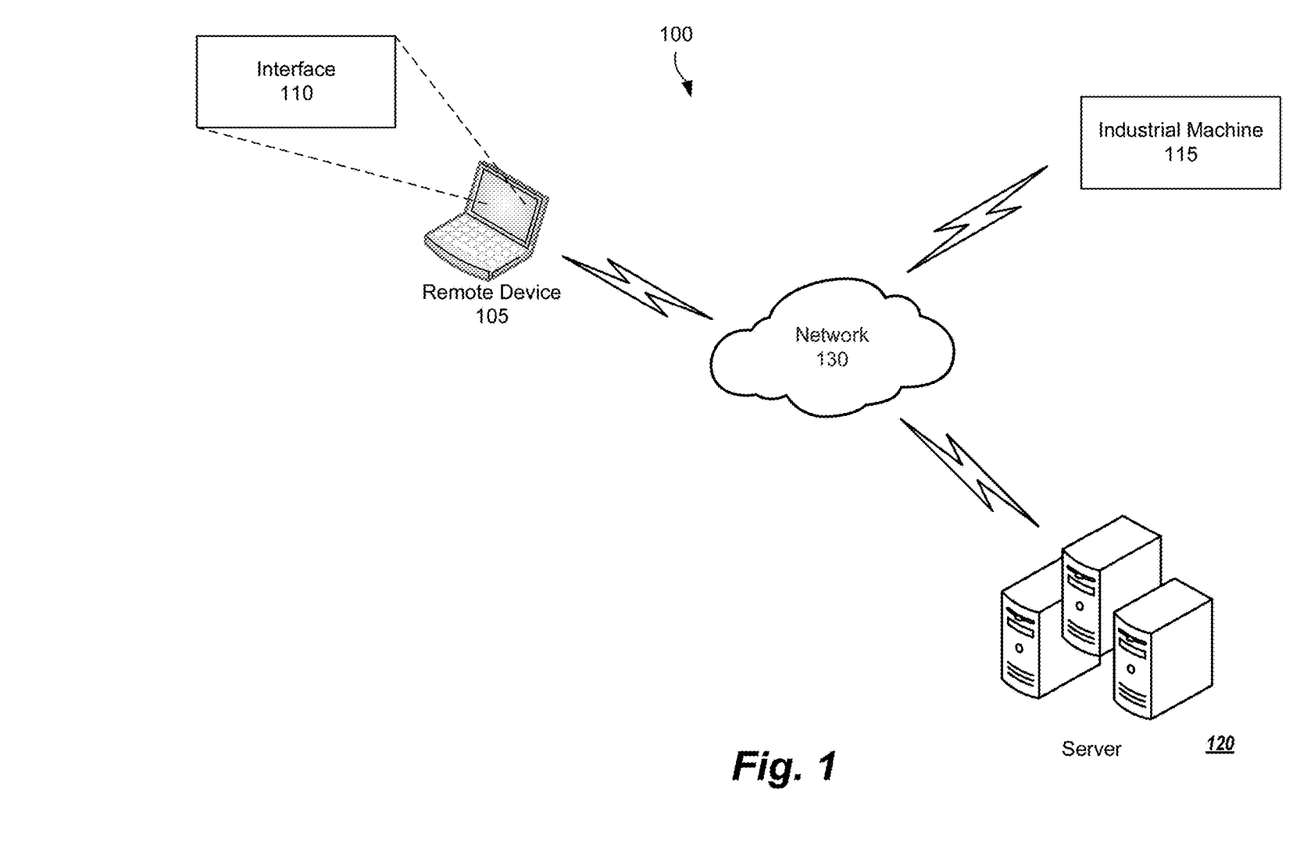
FIG. 1 depicts an exemplary overview of a path command generation system according to one or more aspects of the disclosed subject matter.

Referring now to the drawings, wherein like reference numerals designate identical or corresponding parts throughout the several views, FIG. 1 depicts an exemplary overview of a path command generation system 100 (herein referred to as system 100) according to one or more aspects of the disclosed subject matter. As will be discussed in more detail, one or more methods according to various embodiments of the disclosed subject matter can be implemented using the system 100 or portions thereof. In other words, system 100, or portions thereof, can perform the functions or operations described herein regarding the various methods or portions thereof (including those implemented using a non-transitory computer-readable medium storing a program that, when executed, configures or causes a computer to perform or cause performance of the described method(s) or portions thereof).

The system 100 can include a remote device 105 including an interface 110, an industrial machine 115, and a server 120 communicably coupled via a network 130.

Generally speaking, the system 100 can generate an optimal path command which can be implemented by the industrial machine 115. The optimization can include considering the trade-off between reducing a trajectory error and reducing cycle time.

More specifically, an optimal path command can be generated including providing the shortest cycle time, optimizing an error margin to a user's requirements, and considering the physical boundaries of the industrial machine 115 on which the path command will be implemented (e.g., limited by acceleration and jerk). For example, various input conditions can be received via the interface 110. The remote device 105 (and/or the server 120) can calculate and simulate an optimal path command based on the input conditions. The optimal path command can then be implemented via the industrial machine 115.

Further, the system 100 can include one or more servo motors and a user interface (e.g., user interface 110) to optimize movement of the one or more servo motors so that industrial machines (e.g., industrial machine 115), which are driven by the one or more servo motors, can run under user's requirements (e.g., acceptable trajectory error while the machine runs, acceptable noise made by the machine, acceptable damage on the machine, acceptable total operating time, etc.).

The system 100 can include predetermined shape data (e.g., a set of coordinates that outline a shape in segments) and displays the user interface based on that shape, wherein the user interface includes a plurality of input conditions including setting a maximum acceleration, as well as other input conditions described herein.

The system 100 can run a simulation based on the input conditions entered in the user interface, which simulates the results of operating the one or more servo motors to move along the segments, wherein the speed of each servo motor moving along each segment satisfies a predetermined trajectory error margin with or without consideration of a constraint of the industrial machines, which are driven by the one or more servo motors.

The simulation may generate a plurality of options for the user (e.g., results simulated with values 5% more or less than the value of one or more predetermined input conditions). It should be appreciated that "5%" is an example and other ranges could be used.

If the user is satisfied with either the result or one of the options available, the user can select it on the interface 110. The system 100, in response to receiving a selection of the preferred option via the user interface, can transmit instructions to operate the one or more servo motors based on the selected simulation option (e.g., instructions can include how fast each servo motor should move along each segment).

The output of the system 100 can be one or more path or trajectory commands corresponding to a series of destination points (e.g., X-Y coordinates) for the servo motor. Additionally, the time it takes to move between destination points can be the same (e.g., 1 second) even though the distances can be different. This sets the speed of the servo motor.

If the user is not satisfied with the result or any of options if available, the user can have the system run a simulation based on different input parameters which can be entered by the user in the user interface. Alternatively, or additionally, if the user is not satisfied with the result or any of the options available in terms of constraints of the machines, the user can redesign the machines so that the machines can operate under the result or one of options that correspond with the user's input conditions.

In other words, one or more output conditions (e.g., cycle time, error, etc.) can be calculated for the industrial machine, wherein the one or more output conditions are calculated based on values of input parameters (e.g., jerk, acceleration, velocity, etc.). The industrial machine implements a path command based on the one or more output conditions. Additionally, the one or more output conditions can be calculated for the industrial machine to implement an alternative path command based on alternative values of the input parameters. After calculating the one or more output conditions for each set of input parameters, the one or more output conditions can be selected, wherein the one or more output conditions can be selected based on the calculation for each set of input parameters. A user can select among the input parameters and set the values of the input parameters directly or indirectly. That is, the user can select values (and/or alternative values) for the input parameters for path commands, which are displayed in the user interface. Additionally, the alternative values may be set automatically based on the initial values for the input parameters. Or, the user can select output conditions in the user interface. As a result, the values of the input parameters corresponding to the selected output conditions can be selected. Once the one or more output conditions have been selected, command data corresponding to the path command can be transmitted to the industrial machine, wherein the industrial machine can implement the path command based on the selected output condition.

The system 100 can be applicable to industrial machines, such as laser cutters, which are driven by the one or more servo motors.

The remote device 105 can represent one or more remote devices connected to the industrial machine 115 and the server 120 via the network 130. The remote device 105 can be a smart phone, a computer, a laptop, a tablet, a PDA, and the like. The remote device 105 can include a front end application as an interface 110, for example, as further described in FIGS. 2A-2C. The interface 110 can receive various input conditions from a user. The interface 110 can additionally display the results of a simulation of a path command generated based on the input conditions. Based on the simulation results displayed via the interface 110, the user can provide input that changes the input conditions. When the user is satisfied with the results of the simulation displayed via the interface 110, the path command (e.g., as X-Y axis command data) can be transmitted to the automated factory machine 115. The remote device 105 can include processing circuitry to independently operate and/or assist in operating the system 100.

The industrial machine 115 can represent one or more industrial machines connected to the remote device 105 and the server 120 via the network 130. In one or more embodiments, the industrial machine 115 can include one or more servo motors. The industrial machine 115 can receive a path command (e.g., from one or more of the remote device and the server 120). The industrial machine 115 can receive the path command as X-Y axis command data, for example, wherein the path command as X-Y axis command data can control the position and speed of the one or more servo motors, thereby implementing the received path command. In one or more embodiments, the industrial machine 115 can be a laser cutter driven by one or more servo motors. In other words, the movement of the servo motors of the industrial machine 115 can be optimized so that the industrial machine 115, which is driven by the one or more servo motors, can run under user's requirements (e.g., acceptable trajectory error occurring while the machine runs, acceptable noise made by the machine, acceptable damage on the machine, acceptable total operating time, etc.).

The server 120 can represent one or more servers connected to the remote device 105 and the industrial machine 115 via the network 130. The server 120 can include processing circuitry to perform various processing for the system 100 including receiving the input conditions from interface 110 entered via the remote device 105. Alternatively, the server 120 can include the interface 110 and receive the input conditions directly when the user enters the input conditions via the interface 110. Further, the server 120 can calculate the path command based on the input conditions, as well as simulate the path command. The server 120 can then transmit the results of the simulation to the remote device 105, for example, to be displayed in the interface 110. Alternatively, the server 120 can display the simulation results locally via the interface 110. The server 120 can additionally generate and transmit the path command data (e.g., X-Y axis command data) to the automated factory machine 115 so that the automated factory machine 115 can implement the path command. The server 110 can also take advantage of Edge Computing to prevent limitations associated with existing embedded systems. As a result, the user can implement path commands for the industrial machine 115 from remote locations.

The network 130 can represent one or more networks connecting the remote device 105, the industrial machine 115, and the server 120. The network 130 can be a public network, such as the Internet, or a private network such as a local area network (LAN) or a wide area network (WAN), or any combination thereof and can also include a public switched telephone network (PSTN) or integrated services for digital network (ISDN) sub-networks. The network 130 can also be wired, such as an Ethernet network or a USB port, or can be wireless such as a cellular network including EDGE, 3G, 4G, and LTE/LTE-A wireless cellular systems. The wireless network can also be based on Wi-Fi, Bluetooth, or any other wireless form of communication that is known.

In one or more embodiments, the network 130 can be an industrial network (e.g., CC-Link IE Field, Ethernet/IP, etc.) communicably coupling the interface 110, displayed via the remote device 105, and the server 120. Additionally, the interface 110 displayed via the remoted device 105 can be a human machine interface. Further, the server 120 can be an IPC/PLC as would be understood by one or ordinary skill in the art.

Figure 2A:
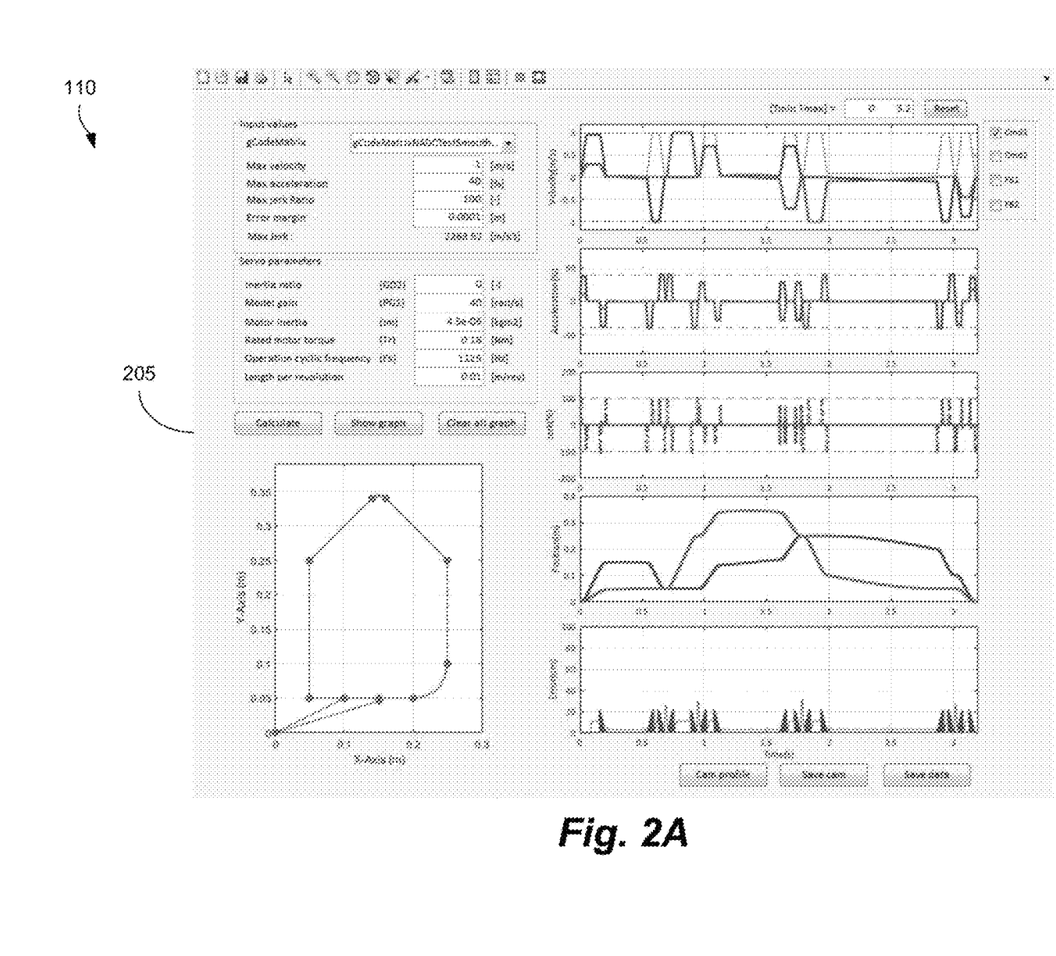
FIG. 2A depicts an exemplary interface displaying results based on a first set of input conditions according to one or more aspects of the disclosed subject matter.
Figure 2B:
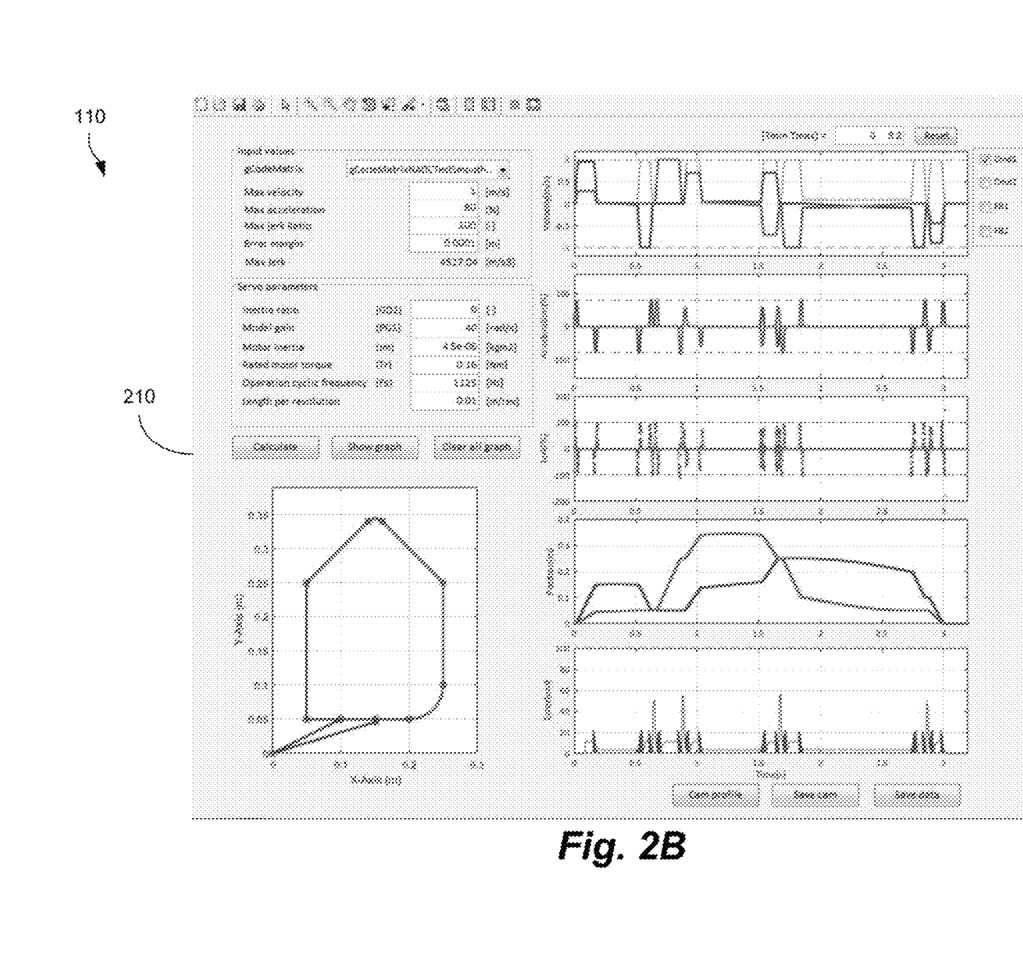
FIG. 2B depicts an exemplary interface displaying results based on a second set of input conditions according to one or more aspects of the disclosed subject matter.
Figure 2C:
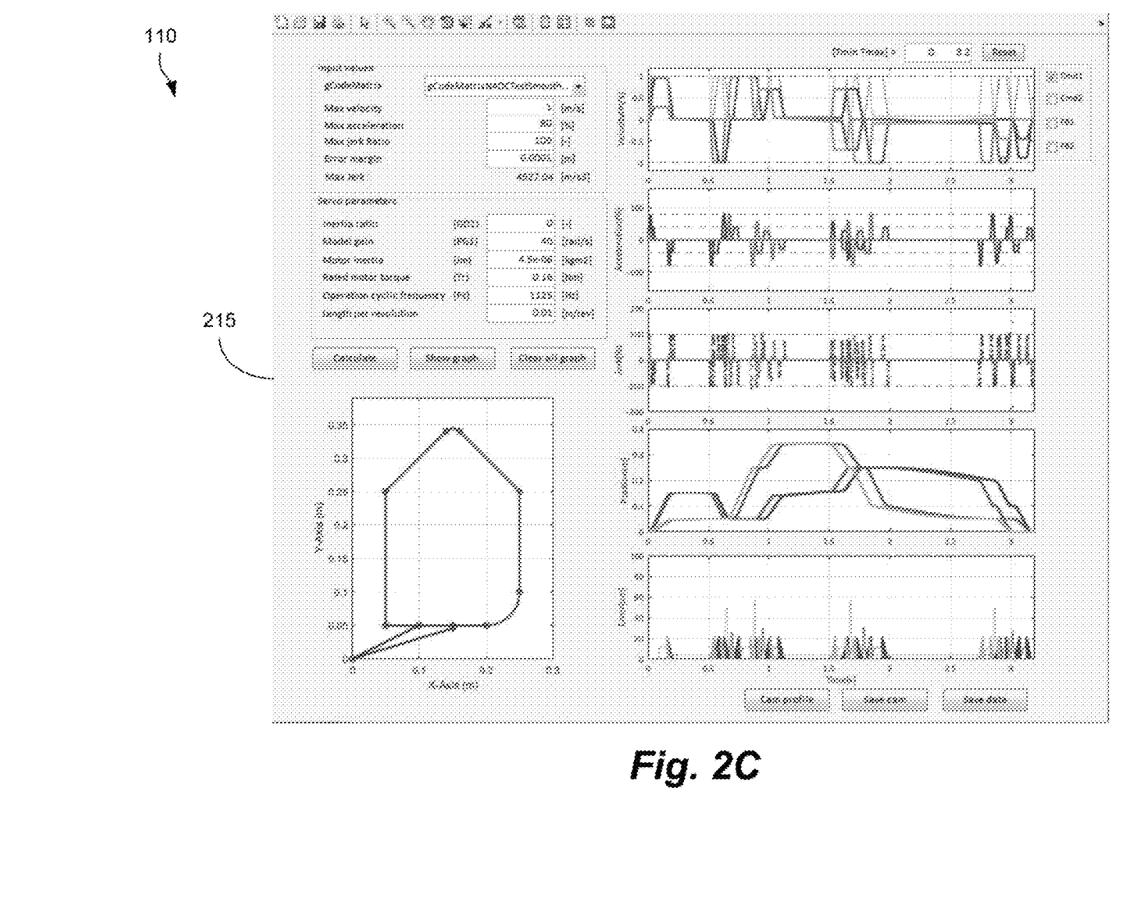
FIG. 2C depicts an exemplary interface displaying results based on the first set and the second set of input conditions according to one or more aspects of the disclosed subject matter.

FIGS. 2A-2C depict exemplary interfaces 110, wherein exemplary interfaces 110 can include results 205, 210, and 215 based on a first set of input conditions, a second set of input conditions, and a combination of the first and second set of input conditions, respectively.

Each interface 110 can include a predetermined set of input options including max velocity (e.g., operation speed), max acceleration, max jerk, error margin, velocity limit (for each axis), torque limit (for each axis), jerk limit (for each axis), and servo response (for each axis). The torque limit can additionally include an acceleration limit for each acceleration because torque is equal to inertia multiplied by acceleration. Additionally, the servo response can include a model gain where model gain is one parameter of a server amplifier and a dominant factor to servo response.

More specifically, FIG. 2A depicts an exemplary interface 110 displaying results 205 based on a first set of input conditions according to one or more aspects of the disclosed subject matter. The first set of input conditions includes max acceleration set at 40%.

FIG. 2B depicts an exemplary interface 110 displaying results 210 based on a second set of input conditions according to one or more aspects of the disclosed subject matter. The second set of input conditions includes max acceleration set at 80%.

FIG. 2C depicts an exemplary interface 110 displaying results 215 based on the first set and the second set of input conditions according to one or more aspects of the disclosed subject matter. The results 215 include a combination of the 40% max acceleration and the 80% max acceleration results for comparison, for example.

Additionally, when the user is satisfied with the results of the simulation displayed via the interface 110, the path command (e.g., as X-Y axis command data) can be transmitted to the automated factory machine 115. For example, Table 1 is an example of the X-Y axis command data that can be sent to the industrial machine 115. It should be appreciated that the rows can continue with additional destination points (e.g., set of coordinates) until the path command for each segment of the shape is complete.

TABLE 1

| Time [s] | Position Command X [m] | Position Command Y [m] | Velocity Command X [m/s] | Velocity Command Y [m/s] |
|---|---|---|---|---|
| 0 | 0 | 0 | 0 | 0 |
| 0.000889 | 1.27E−07 | 3.88E−08 | 7.13E−05 | 2.18E−05 |
| 0.001778 | 4.05E−06 | 1.24E−06 | 0.006484 | 0.001985 |
| 0.002667 | 9.88E−06 | 3.02E−06 | 0.007838 | 0.002399 |
| 0.003556 | 2.03E−05 | 6.20E−06 | 0.012969 | 0.003969 |
| 0.004444 | 3.67E−05 | 1.12E−05 | 0.019667 | 0.006019 |
| 0.005333 | 6.08E−05 | 1.86E−05 | 0.028218 | 0.008636 |
| ... | ... | ... | ... | ... |

Figure 3:
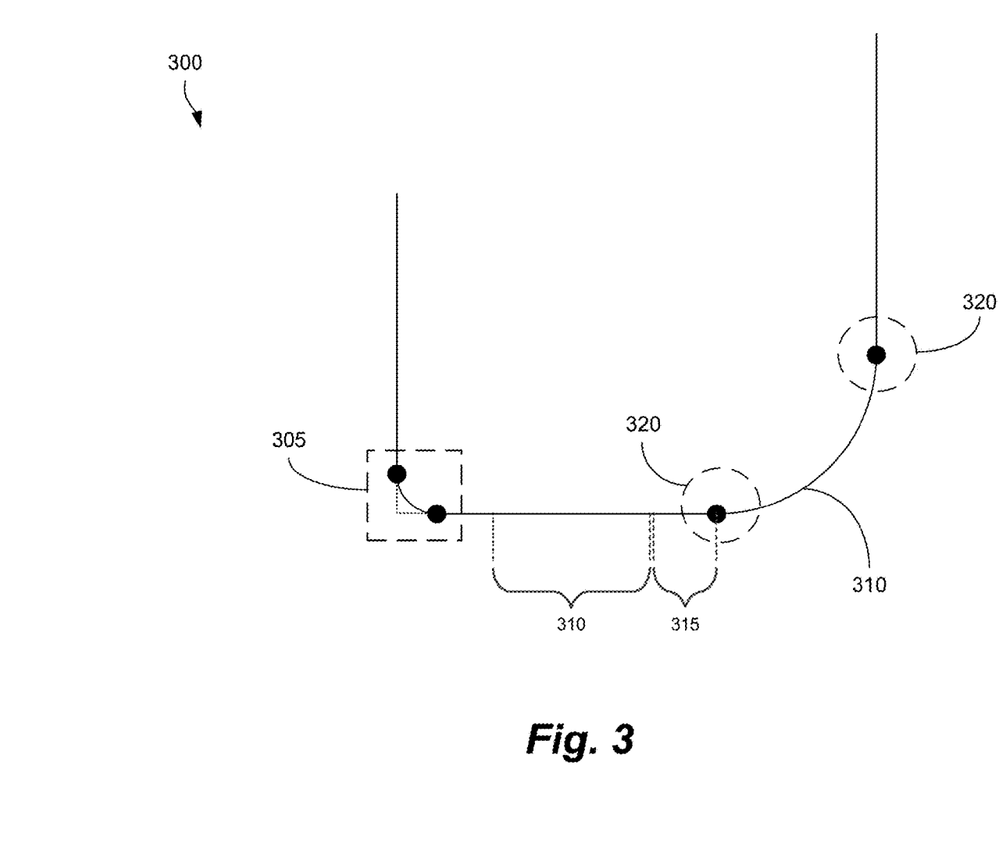
FIG. 3 depicts an exemplary implementation of an optimal path command according to one or more aspects of the disclosed subject matter.

FIG. 3 depicts an exemplary implementation 300 of an optimal path command according to one or more aspects of the disclosed subject matter. The optimal path command can include various sections of the implementation including portions 305, 310, 315, and 320. For example, portion 305 can be a sharp section of the shape which has a small connecting angle. For portions of the path command with a sharp shape and small connecting angle (e.g., portion 305), an arc with a small radius can be inserted without losing accuracy.

Portion 310 can correspond to a straight segment or an arc segment. Based on servo-response and/or shape (e.g., radius of an arc), a command speed can be calculated for each portion 310, wherein the command speed for each portion 310 satisfies a trajectory error margin.

Portion 315 can be positioned on either side of a portion 310. For example, portion 315 can be an interval of acceleration or deceleration on the ends of a straight segment (e.g., portion 310). Based on the direction of the path command, a portion 315 positioned before the portion 310 can be an acceleration interval. Additionally, a portion 315 positioned after the portion 310 can be a deceleration interval.

Adjacent portions 320 can indicate a full segment, wherein the full segment can be associated with a predetermined time interval. In other words, X-Y axis command data can be based on time, as well as position, such that the path command can be instructed to travel between adjacent portions 320 in a predetermined amount of time. Further, acceleration and/or jerk limits for both axes can be considered when making X-Y axis command data based on time, for example. By limiting the jerk, while continuing acceleration/deceleration, noise level and impact caused by changing axis direction can be reduced.

Figure 4:
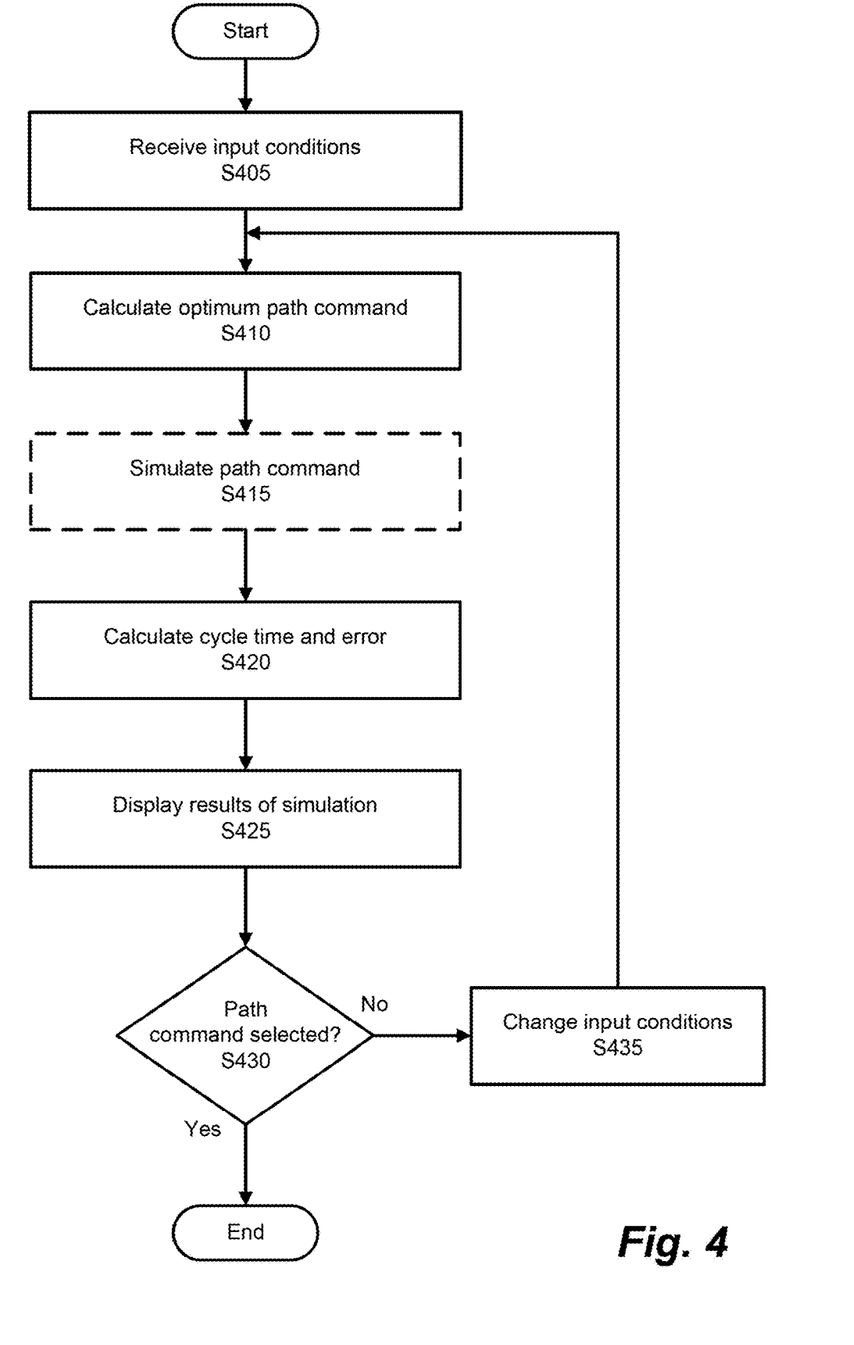
FIG. 4 is an algorithmic flow chart of a method for path command generation according to one or more aspects of the disclosed subject matter.

FIG. 4 is an algorithmic flow chart of a method for path command generation according to one or more aspects of the disclosed subject matter.

In S405, input conditions can be received. Input conditions can include max velocity (e.g., operation speed), max acceleration, max jerk, error margin, velocity limit (for each axis), torque limit (for each axis), jerk limit (for each axis), and servo response (for each axis). The torque limit can additionally include an acceleration limit for each acceleration because torque is equal to inertia multiplied by acceleration. Additionally, the servo response can include a model gain where model gain is one parameter of a server amplifier and a dominant factor to servo response. The input conditions can be received via the interface 110, for example.

In S410, an optimum path command can be calculated based on the received input conditions.

In S415, the path command can be simulated. The path command simulation can provide information to a user so that the user can see a visual display of the path command results. The simulation in S415 may be options when a user changes input conditions in S435.

In S420, cycle time and error can be calculated. Cycle time can be the average time for completing the path command. In other words, the cycle time can be the time period from the path command starting time to the path command ending time.

In S425, results of the simulation (including the cycle time and error) can be displayed via the interface 110, for example. The simulation results can include various information as illustrated in exemplary results 205, 210, and 215 as shown in FIGS. 2A, 2B, and 2C, respectively.

In S430, it can be determined if the path command is acceptable. Determining if the path command is acceptable can be based on the simulation results displayed in S425, for example. A user may determine that the path command is not sufficient based on the results of the simulation, and the user may adjust the input conditions accordingly. If the path command is acceptable, then the process can end. For example, if the user is satisfied with either the result or one of options if available, the user can select it on the user interface 110.

The system 100, in response to receiving a selection of the preferred option via the user interface 110, can transmit instructions to operate the one or more servo motors based on the selected simulation option (e.g., instructions can include how fast each servo motor should move along each segment (e.g., portions 305, 310, 315)). However, if the path command is not acceptable, then input conditions can be changed in S435.

In S435, one or more input conditions can be changed. The one or more input conditions can be changed when a user wants to adjust the path command. After changing the one or more input conditions, the process can return to S410 to calculate the optimum path command based on the new input conditions. The simulate path command step S415 may be optional because the user may have selected new input conditions that are within an error of the previous selection, and a new simulation does not need to be run as a result. The process may continue through S420, S425, and return to S430 to determine if the path command is acceptable.

In the above description of FIG. 4, any processes, descriptions or blocks in flowcharts can be understood as representing modules, segments or portions of code which include one or more executable instructions for implementing specific logical functions or steps in the process, and alternative implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another, or may be combined in various ways. All possible combinations and sub-combinations are intended to fall within the scope of this disclosure.

Additionally, in one or more embodiments, a user cannot adjust the industrial machine 115 by changing more than three input conditions because the user may not anticipate the best combination of input conditions for a certain task. For example, this set-up may prevent a user from changing an input condition that has the biggest influence on the mechanical system, which may prevent damage to the industrial machine.

Further advantages include improving cycle times while minimizing error margin. For example, even when servo-response is not high, the margin of error can be satisfied by optimal command. By adding jerk limitations (while continuing acceleration), the system 100 can reduce noise level and impact caused by changing axis direction (e.g., from a straight line segment to an arc segment) as shown in FIG. 3.

Additionally, the interface 110 can provide an opportunity for a user to preview the path command. Because the results of the simulation can be displayed for user selection, the user can pick the best option for their requirements. Additionally, updates to the input conditions can be changed in real time, thereby providing a quick turnaround for a user to see how different input conditions may affect the simulation. As a result, the user can select the best option and the path command data based on the selection can be transmitted (e.g., from any device (e.g., remote device 105, server 120) displaying the interface, or from the server 120 after the selection occurs at the interface accessible via the remote device 105) to the industrial machine 315.

Further, the interface 110 can display the energy consumption of the optimum path command with the smallest cycle time and the optimum path command with the smallest energy consumption when changing the input conditions, which can provide the user with even more specific information to assist in selecting the best path command option to meet their requirements.

Figure 5:
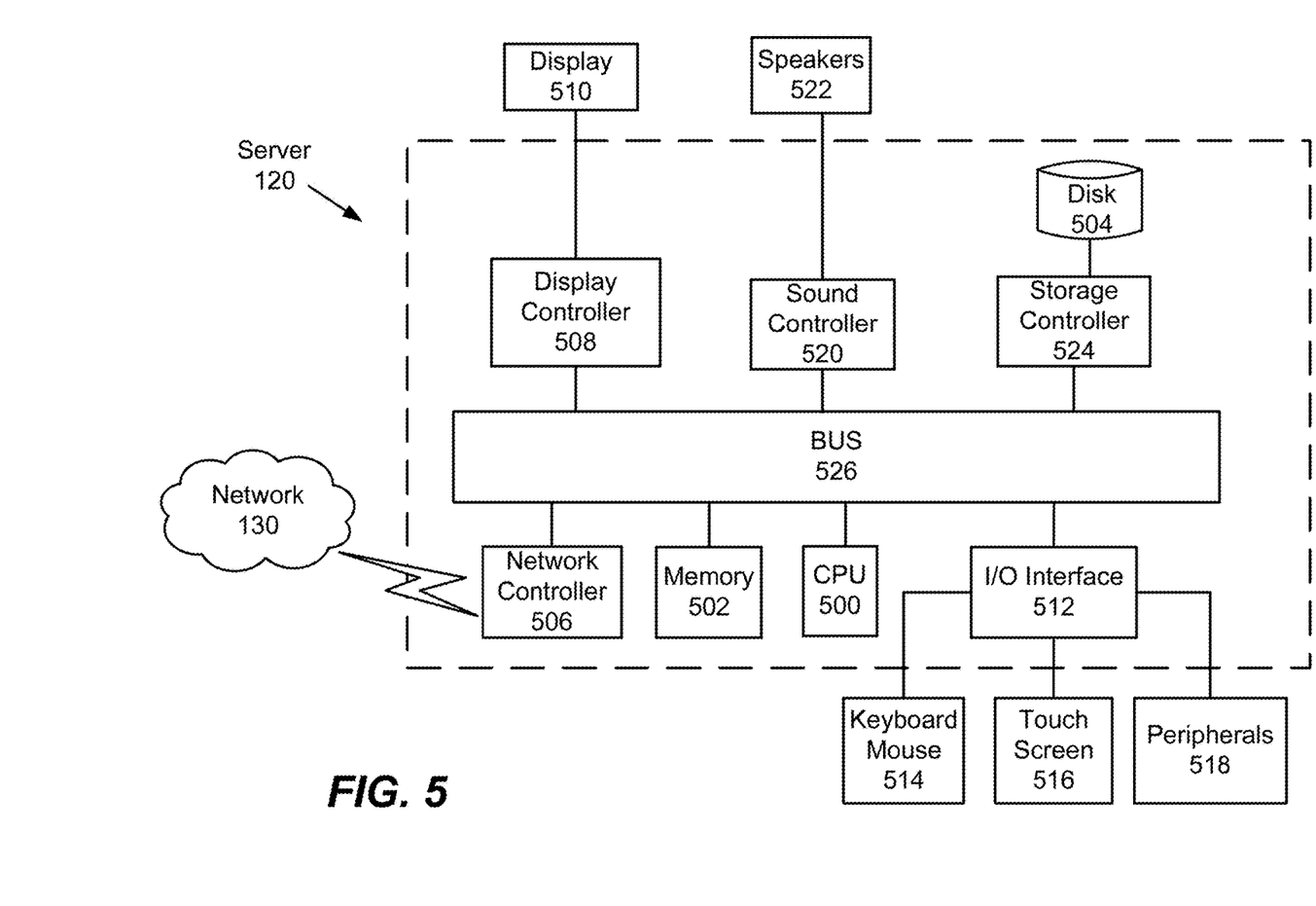
FIG. 5 is a hardware block diagram of a server according to one or more exemplary aspects of the disclosed subject matter.

Next, a hardware description of a computer/device (such as the server 120) according to exemplary embodiments is described with reference to FIG. 5. The hardware description described herein can also be a hardware description of the processing circuitry. In FIG. 5, the server 120 (and/or the remote device 105) includes a CPU 500 which performs one or more of the processes described above/below. The process data and instructions may be stored in memory 502. These processes and instructions may also be stored on a storage medium disk 504 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the server 120 (and/or the remote device 105) communicates, such as a server or computer.

Further, the claimed advancements may be provided as a utility application, background daemon, or component of an operating system, or combination thereof, executing in conjunction with CPU 500 and an operating system such as Microsoft Windows, UNIX, Solaris, LINUX, Apple MAC-OS and other systems known to those skilled in the art.

The hardware elements in order to achieve the server 120 (and/or the remote device 105) may be realized by various circuitry elements. Further, each of the functions of the above described embodiments may be implemented by circuitry, which includes one or more processing circuits. A processing circuit includes a particularly programmed processor, for example, processor (CPU) 500, as shown in FIG. 5. A processing circuit also includes devices such as an application specific integrated circuit (ASIC) and conventional circuit components arranged to perform the recited functions.

In FIG. 5, the server 120 (and/or the remote device 105) includes a CPU 500 which performs the processes described above. The server 120 (and/or the remote device 105) may be a general-purpose computer or a particular, special-purpose machine. In one embodiment, the server 110 (and/or the remote device 105) becomes a particular, special-purpose machine when the processor 500 is programmed to perform all or part of path command generation (and in particular, any of the processes discussed with reference to FIGS. 3 and 4).

Alternatively, or additionally, the CPU 500 may be implemented on an FPGA, ASIC, PLD or using discrete logic circuits, as one of ordinary skill in the art would recognize. Further, CPU 500 may be implemented as multiple processors cooperatively working in parallel to perform the instructions of the inventive processes described above.

The server 120 (and/or the remote device 105) in FIG. 5 also includes a network controller 506, such as an Intel Ethernet PRO network interface card from Intel Corporation of America, for interfacing with network 130. As can be appreciated, the network 130 can be a public network, such as the Internet, or a private network such as an LAN or WAN network, or any combination thereof and can also include PSTN or ISDN sub-networks. The network 130 can also be wired, such as an Ethernet network, or can be wireless such as a cellular network including EDGE, 3G and 4G wireless cellular systems. The wireless network can also be WiFi, Bluetooth, or any other wireless form of communication that is known.

The server 120 (and/or the remote device 105) further includes a display controller 508, such as a graphics card or graphics adaptor for interfacing with display 510, such as a monitor. A general purpose I/O interface 512 interfaces with a keyboard and/or mouse 514 as well as a touch screen panel 516 on or separate from display 510. General purpose I/O interface also connects to a variety of peripherals 518 including printers and scanners.

A sound controller 520 is also provided in the server 120 (and/or the remote device 105) to interface with speakers/microphone 522 thereby providing sounds and/or music.

The general purpose storage controller 524 connects the storage medium disk 504 with communication bus 526, which may be an ISA, EISA, VESA, PCI, or similar, for interconnecting all of the components of the server 120 (and/or the remote device 105). A description of the general features and functionality of the display 510, keyboard and/or mouse 514, as well as the display controller 508, storage controller 524, network controller 506, sound controller 520, and general purpose I/O interface 512 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The invention claimed is:

1. A system, comprising:
   circuitry configured to
   provide a displayable interface to receive information regarding control of an industrial machine,
   calculate an optimum path command,
   simulate the optimum path command based on the calculation of the optimum path command,
   calculate a cycle time and error of the path command,
   determine if the path command is selected, and
   transmit path command data to the industrial machine in response to the selected path command being selected at the displayable interface.

2. The system of claim 1, wherein the displayable interface is configured to
   receive input conditions via the displayable interface,
   display results of the simulation of the optimum path command via the displayable interface,
   receive a selection of the selected path command via the displayable interface, receive updated input conditions when no currently displayed path command is selected, and transmit the path command data corresponding to the selected path command to be implemented at the industrial machine.

3. The system of claim 2, wherein the industrial machine includes one or more servo motors.

4. The system of claim 3, wherein the optimum path command corresponds to a series of destination points for the one or more servo motors.

5. The system of claim 4, wherein the series of destination points are a set of coordinates based on predetermined shape data, wherein the displayable interface is displayed based on the predetermined shape data.

6. The system of claim 5, wherein the optimum path command includes moving the one or more servo motors between destination points, wherein the time it takes to move the servo motors between the destination points is the same amount of time for every destination point.

7. The system of claim 5, wherein the destination points correspond to X-Y coordinates.

8. The system of claim 2, wherein the results of the simulation displayed via the displayable interface can includes a plurality of options, wherein the plurality of options are based on a predetermined range more or less than a value of one or more of the input conditions.

9. The system of claim 2, wherein the input conditions include one or more of max velocity, max acceleration, error margin, velocity limit for each axis, torque limit for each axis, and servo response for each axis.

10. The system of claim 9, wherein the input conditions include max jerk.

11. The system of claim 9, wherein the input conditions include jerk limit for each axis.

12. A method for path command generation, comprising:
calculating, via processing circuitry, an optimum path command;
simulating, via the processing circuitry, the optimum path command based on the calculation of the optimum path command;
calculating, via the processing circuitry, a cycle time and error of the path command;
determining if the path command is selected; and
transmitting path command data to an industrial machine in response to the selected path command being selected.

13. The method of claim 12, wherein the processing circuitry is communicably coupled to an interface, wherein path command generation further comprises:
receiving, via the interface, input conditions as parameters for calculating the optimum path command;
displaying results of the simulation of the optimum path command via the interface;
receiving a selection of the selected path command via the interface;
receiving updated input conditions when no currently displayed path command is selected; and
transmitting the path command data corresponding to the selected path command to be implemented at the industrial machine.

14. The method of claim 13, wherein the optimum path command corresponds to a series of destination points for one or more servo motors of the industrial machine.

15. The method of claim 14, wherein the series of destination points are a set of coordinates based on predetermined shape data, wherein the interface is displayed based on the predetermined shape data.

16. The method of claim 15, wherein the optimum path command includes moving the one or more servo motors between destination points, wherein the time it takes to move the one or more servo motors between the destination points is the same amount of time for every destination point.

17. The method of claim 15, wherein the destination points correspond to X-Y coordinates.

18. An interface accessible via a remote device, comprising:
processing circuitry configured to
receive input conditions via the interface,
display results of a simulation of the optimum path command via the interface,
receive a selection of an selected path command via the interface,
receive updated input conditions when no currently displayed path command is selected, and
transmit path command data corresponding to the selected path command to an industrial machine.

19. The interface of claim 18, wherein the industrial machine includes one or more servo motors, wherein the optimum path command corresponds to a series of destination points for the one or more servo motors, wherein the series of destination points are a set of coordinates based on predetermined shape data, wherein the interface is displayed based on the predetermined shape data.

20. The interface of claim 19, wherein the optimum path command includes moving the one or more servo motors between destination points, wherein the time it takes to move the servo motors between the destination points is the same amount of time for every destination point, wherein the destination points correspond to X-Y coordinates.

21. The interface of claim 18, wherein the results of the simulation displayed via the interface can includes a plurality of options, wherein the plurality of options are based on a predetermined range more or less than a value of one or more of the input conditions.

22. The interface of claim 21, wherein the input conditions include max velocity, max acceleration, error margin, velocity limit for each axis, torque limit for each axis, and servo response for each axis.

23. The interface of claim 22, wherein the input conditions include max jerk.

24. The interface of claim 22, wherein the input conditions include jerk limit for each axis.

25. A system, comprising:
processing circuitry configured to
calculate one or more first output conditions based on values of two or more input parameters,
calculate one or more second output conditions based on alternative values of the two or more input parameters,
determine which of at least one of the one or more first output conditions or the one or more second output conditions is selected, an output condition being selected based on the calculating of the one or more first output conditions and one or more second output conditions for each set of input parameters, and
transmit command data to an industrial machine, the command data corresponding to a path command implemented by the industrial machine, the command data being based on the selected output condition.

26. An interface, comprising:

processing circuitry configured to calculate one or more first output conditions based on values of two or more input parameters, calculate one or more second output conditions based on alternative values of the two or more input parameters, determine which of at least one of the one or more first output conditions and the one or more second output conditions is selected, an output condition being selected based on the calculating of the one or more first output conditions and one or more second output conditions for each set of input parameters, and transmit command data to an industrial machine, the command data corresponding to a path command implemented by the industrial machine, the command data being based on the selected output condition.

27. A method, comprising:

calculating, via processing circuitry, one or more first output conditions based on values of two or more input parameters, calculating, via the processing circuitry, one or more second output conditions based on alternative values of the two or more input parameters, determining, via the processing circuitry, which of at least one of the one or more first output conditions and the one or more second output conditions is selected, an output condition being selected based on the results of calculating the one or more first output conditions and one or more second output conditions for each set of input parameters, and transmitting, via the processing circuitry, command data to an industrial machine, the command data corresponding to a path command implemented by the industrial machine, the command data being based on the selected output condition.

* * * * *